(12) United States Patent
Utsumi et al.

(10) Patent No.: US 7,777,311 B2
(45) Date of Patent: Aug. 17, 2010

(54) CIRCUIT SUBSTRATE, MOLDING SEMICONDUCTOR DEVICE, TRAY AND INSPECTION SOCKET

(75) Inventors: Masaki Utsumi, Kyoto (JP); Takashi Takata, Shiga (JP); Masahiro Iidaka, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/056,378

(22) Filed: Mar. 27, 2008

(65) Prior Publication Data

US 2008/0283985 A1 Nov. 20, 2008

(30) Foreign Application Priority Data

May 18, 2007 (JP) .............................. 2007-132235

(51) Int. Cl.
*H01L 23/52* (2006.01)
*B65B 3/02* (2006.01)

(52) U.S. Cl. ................ 257/676; 257/777; 257/E23.141; 257/E21.502; 257/686; 438/121; 438/123; 206/725

(58) Field of Classification Search ................ 257/675, 257/676, 777, 787, 712, 686, 698, 700, 723, 257/E23.038, E23.054, E23.124, E23.125, 257/E23.126, E21.504, E21.599, E21.502, 257/E23.031, E23.101; 438/476, 460, 112, 438/116, 113, 108, 622; 206/725, 714, 711, 206/518, 564, 726

See application file for complete search history.

(56) References Cited

U.S. PATENT DOCUMENTS

| 4,700,214 A * | 10/1987 | Johnson ...................... 257/209 |
| 2001/0032800 A1* | 10/2001 | Numazaki et al. ........... 206/725 |
| 2006/0054532 A1* | 3/2006 | Ochi .......................... 206/725 |
| 2006/0220221 A1* | 10/2006 | Shimanuki .................. 257/700 |

FOREIGN PATENT DOCUMENTS

| JP | 9-64244 | 3/1997 |
| JP | 2002-16193 | 1/2002 |
| JP | 2006-100297 | 4/2006 |

* cited by examiner

*Primary Examiner*—Victor A Mandala
*Assistant Examiner*—Whitney Moore
(74) *Attorney, Agent, or Firm*—Steptoe & Johnson LLP

(57) ABSTRACT

Vias 7 penetrating a circuit substrate 2 or a seal ring 8 are provided on a part or the entire outer periphery of a molding semiconductor device 1 or in the cut region of the circuit substrate 2, so that adhesion between a substrate and a core 2C in the circuit substrate 2 is improved. Therefore, it is possible to suppress the exfoliation of the circuit substrate 2, improving the yields.

19 Claims, 13 Drawing Sheets

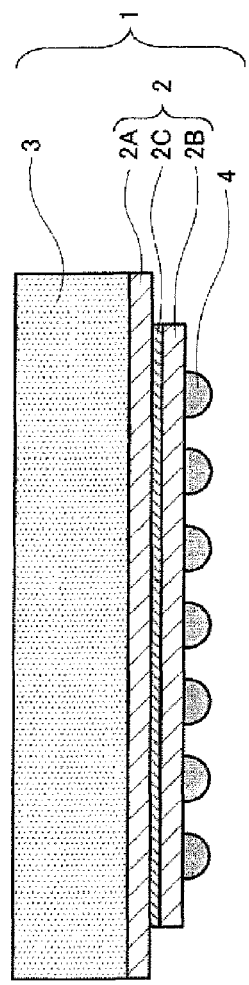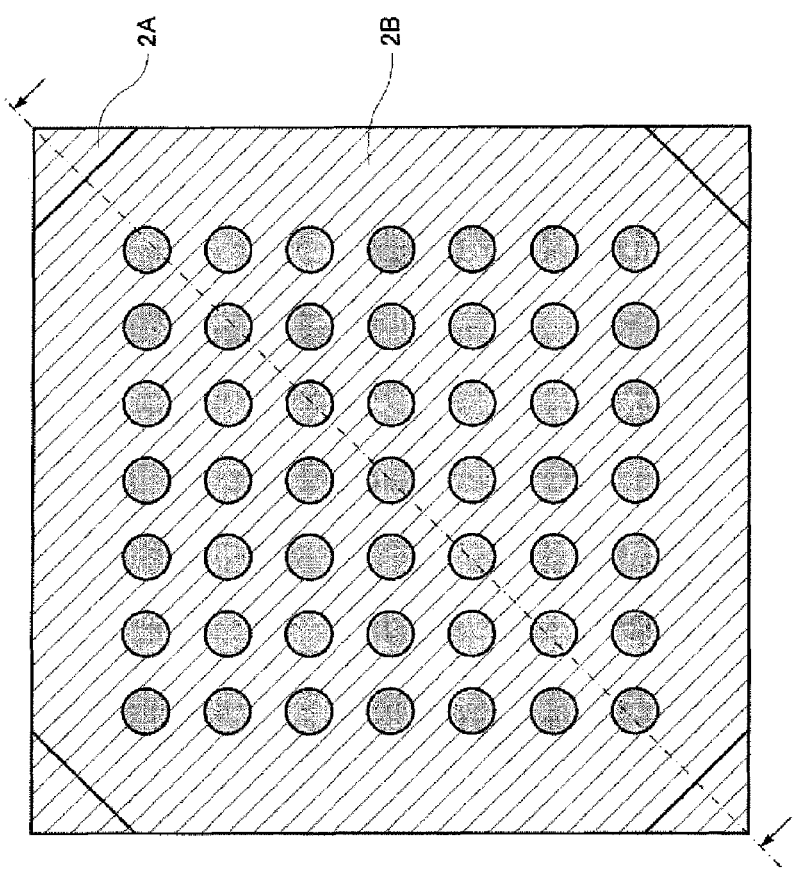
FIG. 8A
FIG. 8B

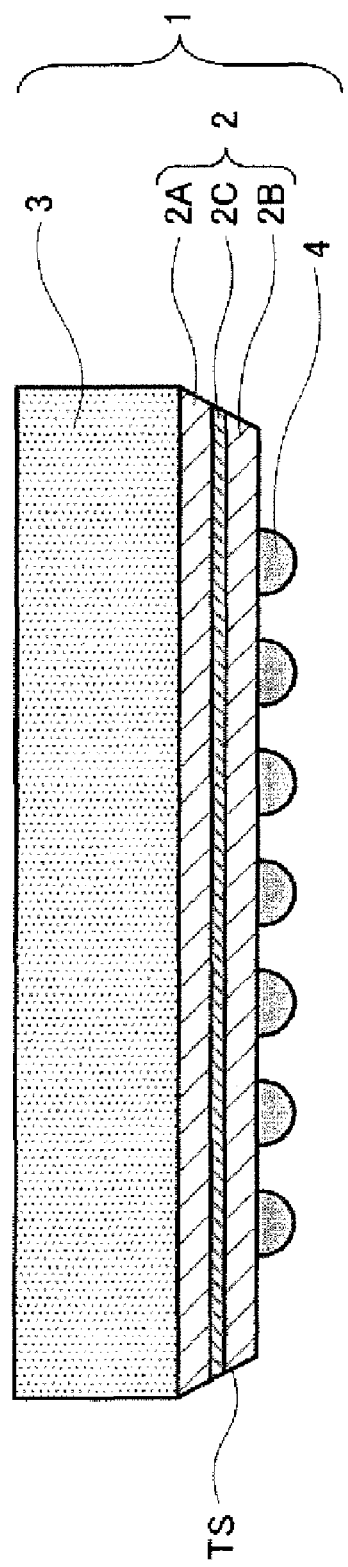

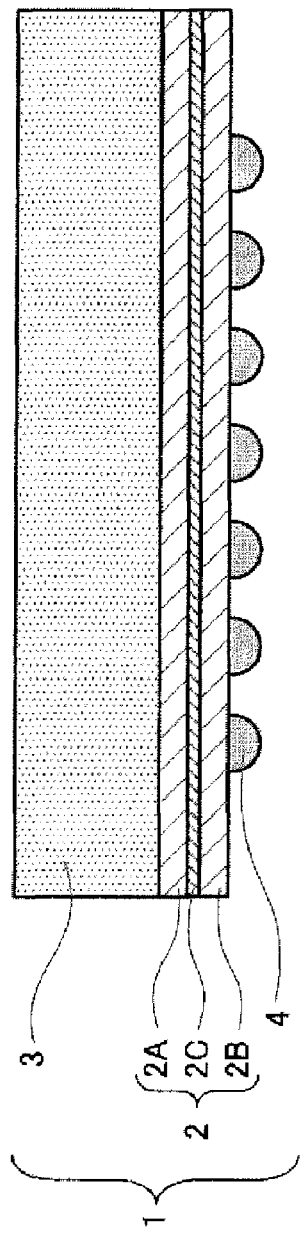
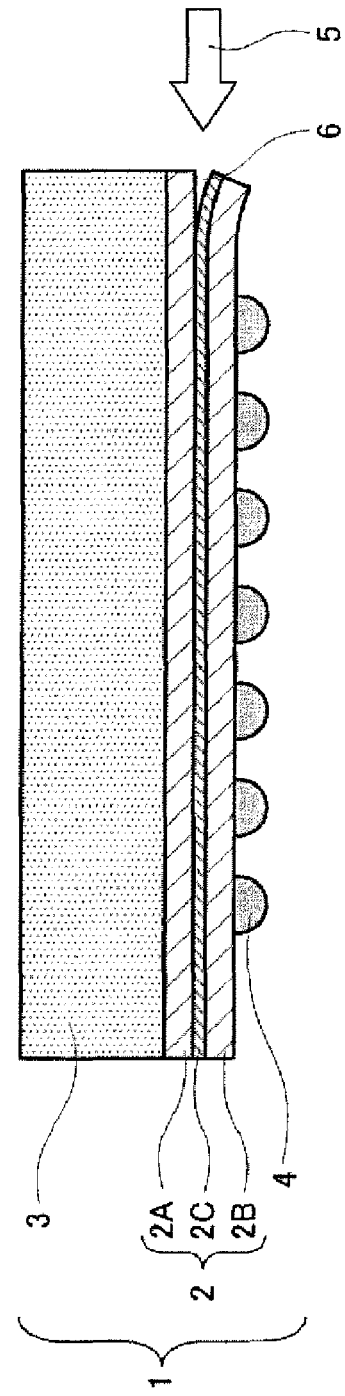
FIG. 13A PRIOR ART
FIG. 13B PRIOR ART

CIRCUIT SUBSTRATE, MOLDING SEMICONDUCTOR DEVICE, TRAY AND INSPECTION SOCKET

PRIORITY DATA

The present application claims priority to Japanese Patent Application No. 2007-132235, filed May 18, 2007, the entire contents of which are hereby incorporated by reference.

FIELD OF THE INVENTION

The present invention relates to a circuit substrate on which a plurality of semiconductor chips can be mounted, a molding semiconductor device formed by dividing the circuit substrate on which the semiconductor chips are mounted, a tray for storing the molding semiconductor device, and an inspection socket used when inspecting the molding semiconductor device.

BACKGROUND OF THE INVENTION

In recent years, high-density packaging has been increasingly demanded for semiconductor components in response to a size reduction and advanced functionality of electronic equipment. Accordingly, molding semiconductor devices have rapidly become smaller and thinner in which semiconductor chips and substrates having circuits formed thereon are integrally molded with molding resin, and various ideas for reducing the production cost and increasing the productivity have been adopted.

Referring to FIGS. 13A and 13B, the following will describe a conventional molding semiconductor device.

FIGS. 13A and 13B show the configuration of a conventional circuit substrate.

FIG. 13A shows a molding semiconductor device 1 formed by mounting a plurality of semiconductor chips (not shown) on a circuit substrate 2 with a die attach material (not shown) interposed between the semiconductor chips and the circuit substrate 2, electrically connecting the semiconductor chips (not shown) to the circuit substrate 2 via wires (not shown), and molding the semiconductor chips (not shown) with resin 3. The circuit substrate 2 is divided into the molding semiconductor devices 1 by dicing or die machining. The circuit substrate 2 has electrode pads and wiring provided on a first surface of a substrate 2A to electrically connect a semiconductor chip mounting region and the semiconductor chip, a cut region around the electrode pads and wiring, and external terminals 4 provided on a second surface of a substrate 2B, the external terminals 4 being formed on the ends of vias electrically connected from the first surface. The circuit substrate 2 further includes a core 2C provided between the substrates 2A and 2B to suppress electrical leakage between the substrates 2A and 2B, and the cut region is provided in a similar manner to the cut region of the substrate 2A.

DISCLOSURE OF THE INVENTION

In this case, as shown in FIG. 13B, an impulsive force 5 is applied to the circuit substrate 2 during dicing and die machining and when the molding semiconductor device 1 having been divided from the circuit substrate 2 by dicing or die machining is stored in a tray (not shown) or an inspection socket (not shown) for electrically measuring the molding semiconductor device 1. Thus in the circuit substrate 2, exfoliation including a crack 6 may occur between the substrate 2A and the core 2C or between the substrate 2B and the core 2C. In this state, water, moistures and so on enter the crack 6 and cause migration problems that lead to a break (popcorn phenomenon) and an electrical short-circuit of the molding semiconductor device 1 during secondary packaging. Further, the crack 6 may be expanded by the impulsive force 5 and may cause a short circuit on electrical conduction between the molding semiconductor device 1 and the external terminals 4.

An object of the present invention is to prevent the occurrence of a crack in the circuit substrate of a molding semiconductor device and to improve the yields.

In order to attain the object, a circuit substrate of the present invention is divided into a plurality of molding semiconductor devices by cutting the circuit substrate at cut regions after mounting a plurality of semiconductor chips on the circuit substrate and molding the semiconductor chips with resin, the circuit substrate including: a first substrate; a second substrate; a core interposed between the first substrate and the second substrate; a region on a first surface for mounting the semiconductor chip; external terminals formed on a second surface on a backside of the first surface and electrically connected to the semiconductor chip; and penetrating members penetrating the circuit substrate.

The penetrating member is at least one via.

The penetrating member is sealing continuously formed near the outer periphery of the region of the molding semiconductor device.

The penetrating member is formed on each corner of the region of the molding semiconductor device.

The penetrating member is formed on each side of the region of the molding semiconductor device.

The penetrating member is formed on a side of the cut region, the side being adjacent to the molding semiconductor device.

The penetrating member is formed on the boundary of the region of the molding semiconductor device and the cut region.

A circuit substrate of the present invention is divided into a plurality of molding semiconductor devices by cutting the circuit substrate at cut regions after mounting a plurality of semiconductor chips on the circuit substrate and molding the semiconductor chips with resin, the circuit substrate including: a first substrate; a second substrate; a core interposed between the first substrate and the second substrate; a region on a first surface for mounting the semiconductor chip; and external terminals formed on a second surface on a backside of the first surface and electrically connected to the semiconductor chip, wherein the circuit substrate is partially removed.

When the circuit substrate is partially removed, the core and one of the first and second substrates are removed in a predetermined range on the corners of the region of the molding semiconductor device.

When the circuit substrate is partially removed, the ends of the circuit substrate are diagonally removed from the surface for mounting the semiconductor chip to the surface for forming the external terminals, toward the inside of the molding semiconductor device.

The molding semiconductor device of the present invention is formed by mounting the semiconductor chip on the first surface of the circuit substrate while electrically connecting the semiconductor chip to the first surface, and cutting the circuit substrate at the cut regions.

A tray of the present invention stores a molding semiconductor device in which a semiconductor chip is mounted on a first surface of a circuit substrate while electrically connected to the first surface, external terminals electrically connected to the semiconductor chip are provided on a second surface on a backside of the first surface, and the first surface having the semiconductor chip mounted thereon is molded with resin, wherein the molding semiconductor device is held by three points including the external terminals and two opposed surfaces of surfaces formed by the resin.

Further, a tray of the present invention stores a molding semiconductor device in which a semiconductor chip is mounted on a first surface of a circuit substrate while electrically connected to the first surface, external terminals electrically connected to the semiconductor chip are provided on a second surface on the backside of the first surface, and the first surface having the semiconductor chip mounted thereon is molded with resin, the tray being stacked when used, wherein one of the circuit substrate and the external terminals of the molding semiconductor device is held by the tray for storing the molding semiconductor device, and the opposite surface of the resin from the circuit substrate is held by a tray stacked directly above.

An inspection socket of the present invention stores a molding semiconductor device in which a semiconductor chip is mounted on a first surface of a circuit substrate while electrically connected to the first surface, external terminals electrically connected to the semiconductor chip are provided on a second surface on the backside of the first surface, and the first surface having the semiconductor chip mounted thereon is molded with resin, wherein the molding semiconductor device is held by three points including the external terminals and two opposed surfaces of surfaces formed by the resin.

BRIEF DESCRIPTION OF THE DRAWINGS

FIG. 8A shows a molding semiconductor device in which one of substrates and a core are removed on the corners of a circuit substrate according to the second embodiment;

FIG. 8B shows the molding semiconductor device in which one of the substrates and the core are removed on the corners of the circuit substrate according to the second embodiment;

FIG. 9 shows a molding semiconductor device having slopes on the corners of a circuit substrate according to the second embodiment;

FIG. 13A shows the configuration of a conventional circuit substrate; and

FIG. 13B shows the configuration of the conventional circuit substrate.

DESCRIPTION OF THE EMBODIMENTS

Exemplary embodiments of a molding semiconductor device and a method of manufacturing the same according to the present invention will now be described in accordance with the accompanying drawings.

First Embodiment

Figure 1:
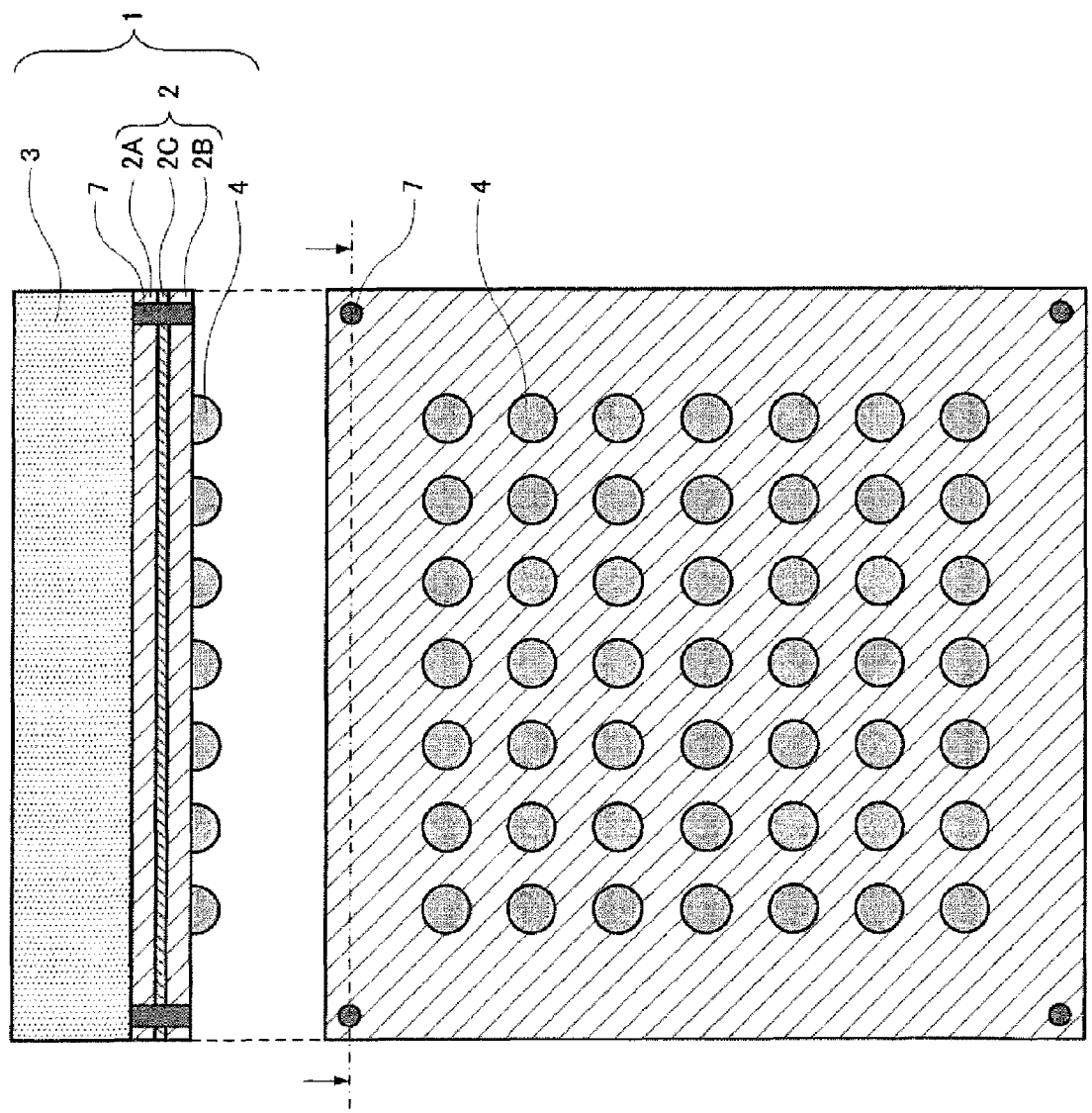
FIG. 1 shows a molding semiconductor device including vias on the corners of a circuit substrate according to a first embodiment.

FIG. 1 shows a molding semiconductor device having vias on the corners of a circuit substrate according to a first embodiment.

In FIG. 1, a circuit substrate 2 has electrode pads and wiring provided on a first surface of a substrate 2A to electrically connect a semiconductor chip mounting region and a semiconductor chip, a cut region provided around the electrode pads and wiring to divide the circuit substrate 2 into the molding semiconductor devices, and external terminals 4 provided on a second surface of a substrate 2B, the external terminals 4 being formed on the ends of vias electrically connected from the first surface. The substrate 2A and the substrate 2B are joined to each other via a core 2C for suppressing electrical leakage between the substrates 2A and 2B, and the cut region is provided around the core 2C. A molding semiconductor device 1 is manufactured by mounting a plurality of semiconductor chips (not shown) on the circuit substrate 2 with a die attach material (not shown) interposed between the semiconductor chips and the circuit substrate 2, electrically connecting the semiconductor chips (not shown) to the circuit substrate 2 via wires (not shown), molding the semiconductor chips (not shown) with resin 3, and dividing the circuit substrate 2 by dicing or die machining.

The molding semiconductor device 1 of FIG. 1 has vias 7 disposed on the corners in the circuit substrate 2. The vias 7 penetrate both sides of the circuit substrate 2. In the example of FIG. 1, the vias 7 are disposed respectively on the four corners and the corners may have any given number of vias 7.

By disposing the vias 7 on the corners of the circuit substrate 2, adhesion between the substrates and the core improves on the corners and thus unlike the prior art, it is possible to suppress exfoliation including a crack between the substrate 2A and the core 2C or between the substrate 2B and the core 2C in the circuit substrate 2. The exfoliation is caused by an impulsive force applied to the circuit substrate 2 during dicing or die machining and an impulsive force applied when the molding semiconductor device 1 having been divided from the circuit substrate 2 by dicing or die machining is stored in a tray or an inspection socket for electrically measuring the molding semiconductor device 1.

Figure 2:
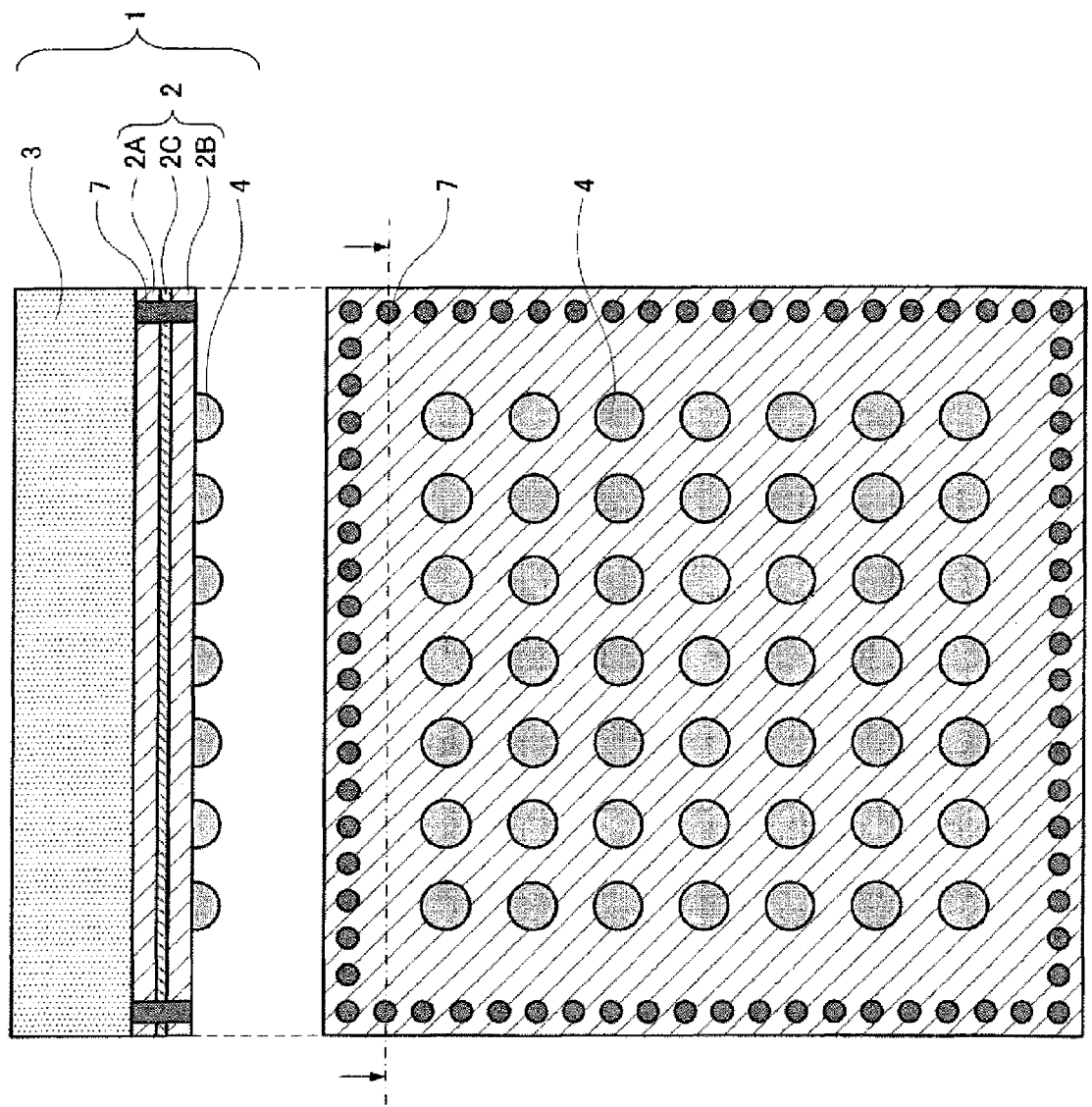
FIG. 2 shows a molding semiconductor device including vias on the outer periphery of a circuit substrate according to the first embodiment.

FIG. 2 shows a molding semiconductor device having vias on the outer periphery of a circuit substrate according to the first embodiment.

In FIG. 2, a circuit substrate 2 has electrode pads and wiring provided on a first surface of a substrate 2A to electrically connect a semiconductor chip mounting region and a semiconductor chip, a cut region provided around the electrode pads and wiring to divide the circuit substrate 2 into the molding semiconductor devices, and external terminals 4 provided a second surface of a substrate 2B, the external terminals 4 being formed on the ends of the vias electrically connected from the first surface. The substrate 2A and the substrate 2B are joined to each other via a core 2C for suppressing electrical leakage between the substrates 2A and 2B, and the cut region is provided around the core 2C. A molding semiconductor device 1 is manufactured by mounting a plurality of semiconductor chips (not shown) on the circuit substrate 2 with a die attach material (not shown) interposed between the semiconductor chips and the circuit substrate 2, electrically connecting the semiconductor chips (not shown) to the circuit substrate 2 via wires (not shown), molding the semiconductor chips (not shown) with resin 3, and dividing the circuit substrate 2 by dicing or die machining.

In the molding semiconductor device 1 of FIG. 2, a plurality of vias 7 penetrating both sides of the circuit substrate 2 are provided on the corners and the outer periphery in the circuit substrate 2 so as to be close to the cut region, so that adhesion between the substrates and the core 2C is improved on the corners. In the example of FIG. 2, the vias 7 in a single row are disposed at regular intervals over the outer periphery of the molding semiconductor device 1. The vias 7 may be disposed in any number of rows, at given intervals, and on any one of the sides. Although the adhesion is improved by disposing the vias on the corners, the vias may not be provided on the corners when sufficient adhesion has been obtained.

By disposing the vias 7 on the outer periphery of the circuit substrate 2, adhesion between the substrates and the core improves on the outer periphery of the circuit substrate 2 and thus unlike the prior art, it is possible to suppress exfoliation including a crack between the substrate 2A and the core 2C or between the substrate 2B and the core 2C in the circuit substrate 2, on the corners and the outer periphery of the molding semiconductor device 1. The exfoliation is caused by an impulsive force applied to the circuit substrate 2 during dicing or die machining and an impulsive force applied when the molding semiconductor device 1 having been divided from the circuit substrate 2 by dicing or die machining is stored in a tray or an inspection socket for electrically measuring the molding semiconductor device 1.

Figure 3:
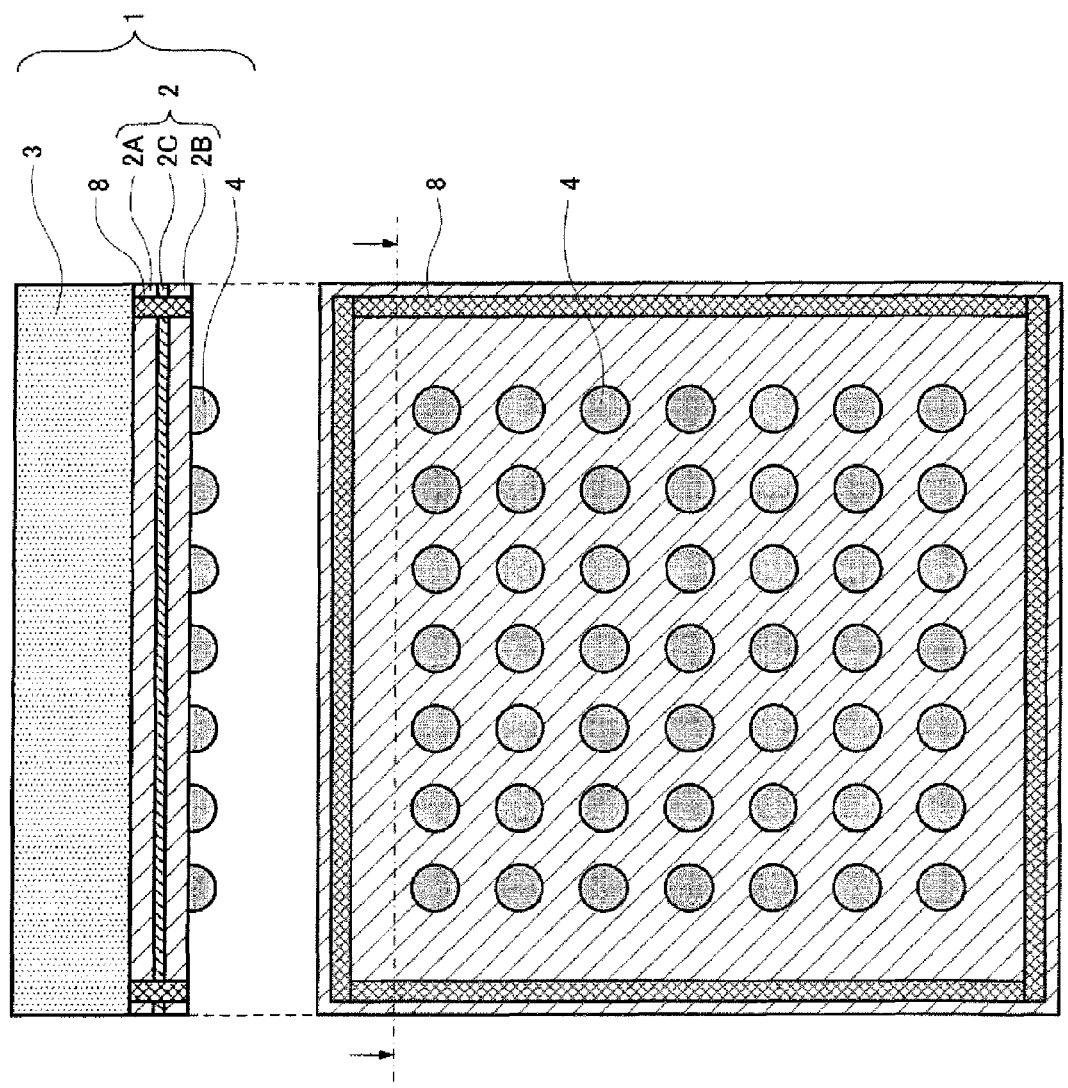
FIG. 3 shows a molding semiconductor device including a seal ring on the outer periphery of a circuit substrate according to the first embodiment.

FIG. 3 shows a molding semiconductor device having a seal ring on the outer periphery of a circuit substrate according to the first embodiment.

In FIG. 3, a circuit substrate 2 has electrode pads and wiring provided on a first surface of a substrate 2A to electrically connect a semiconductor chip mounting region and a semiconductor chip, a cut region provided around the electrode pads and wiring to divide the circuit substrate 2 into the molding semiconductor devices, and external terminals 4 provided on a second surface of a substrate 2B, the external terminals 4 being formed on the ends of vias electrically connected from the first surface. The substrate 2A and the substrate 2B are joined to each other via a core 2C for suppressing electrical leakage between the substrates 2A and 2B, and the cut region is provided around the core 2C. A molding semiconductor device 1 is manufactured by mounting a plurality of semiconductor chips (not shown) on the circuit substrate 2 with a die attach material (not shown) interposed between the semiconductor chips and the circuit substrate 2, electrically connecting the semiconductor chips (not shown) to the circuit substrate 2 via wires (not shown), molding the semiconductor chips (not shown) with resin 3, and dividing the circuit substrate 2 by dicing or die machining.

In the molding semiconductor device 1 of FIG. 3, a continuous seal ring 8 penetrating both sides of the circuit substrate 2 is provided on the corners and the outer periphery in the circuit substrate 2, so that adhesion between the substrates and the core 2C is improved on the corners and the outer periphery.

By disposing the seal ring 8 on the outer periphery of the circuit substrate 2, adhesion between the substrates and the core is improved on the outer periphery of the circuit substrate 2 and thus unlike the prior art, it is possible to suppress exfoliation including a crack between the substrate 2A and the core 2C or between the substrate 2B and the core 2C in the circuit substrate 2, on the corners and outer periphery of the molding semiconductor device 1. The exfoliation is caused by an impulsive force applied to the circuit substrate 2 during dicing or die machining and an impulsive force applied when the molding semiconductor device 1 having been divided from the circuit substrate 2 by dicing or die machining is stored in a tray or an inspection socket for electrically measuring the molding semiconductor device 1.

Second Embodiment

Figure 4:
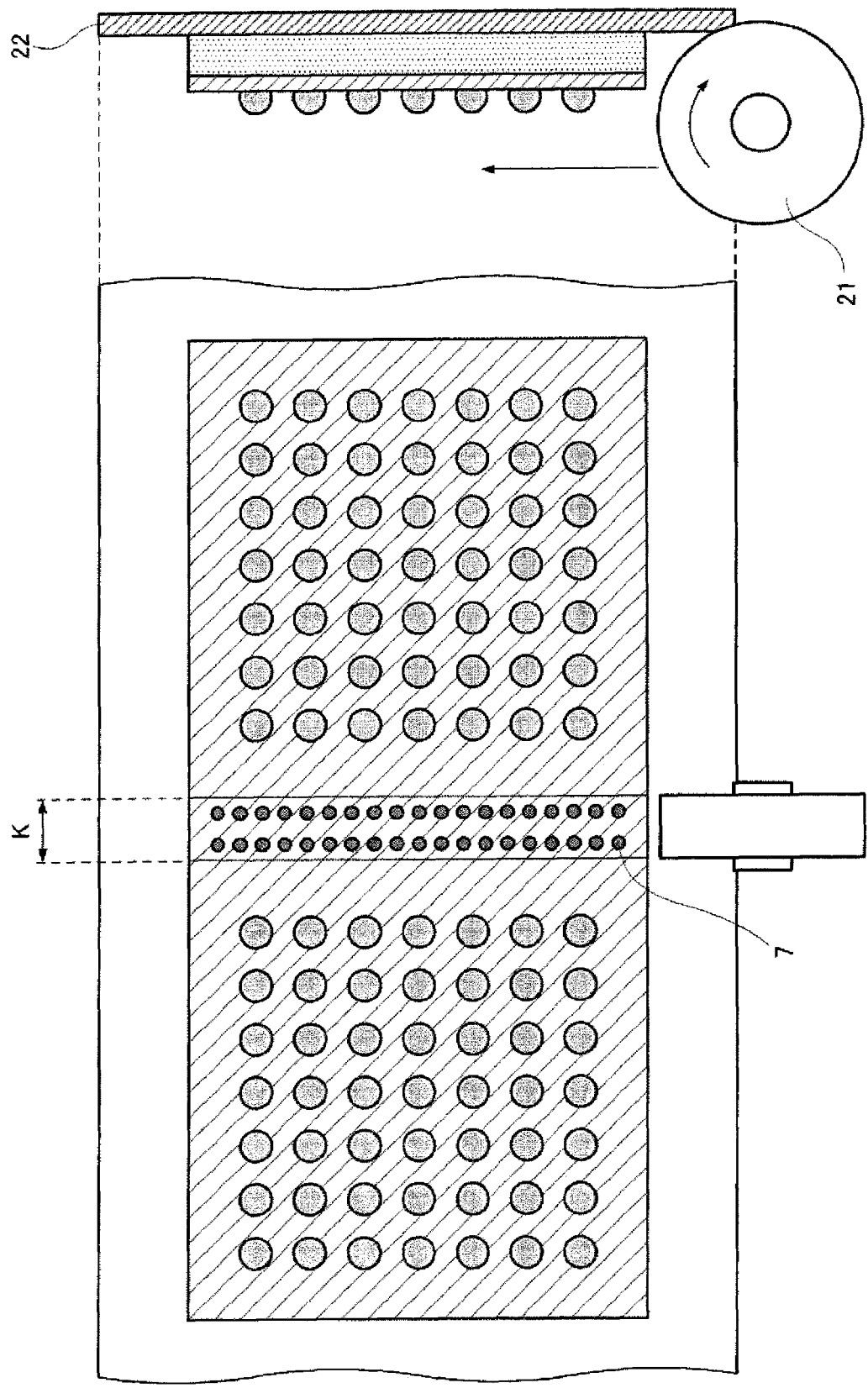
FIG. 4 shows a molding semiconductor device including vias in the cut region of a circuit substrate according to a second embodiment.

FIG. 4 shows a molding semiconductor device having vias in a cut region of a circuit substrate according to a second embodiment.

Also in the second embodiment, as shown in FIGS. 1 to 3, a circuit substrate 2 has electrode pads and wiring provided on a first surface of a substrate 2A to electrically connect a semiconductor chip mounting region and a semiconductor chip, a cut region provided around the electrode pads and wiring to divide the circuit substrate 2 into the molding semiconductor devices, and external terminals 4 provided on a second surface of a substrate 2B, the external terminals 4 being formed on the ends of vias electrically connected from the first surface. The substrate 2A and the substrate 2B are joined to each other via a core 2C for suppressing electrical leakage between the substrates 2A and 2B, and the cut region is provided around the core 2C. A molding semiconductor device 1 is manufactured by mounting a plurality of semiconductor chips (not shown) on the circuit substrate 2 with a die attach material (not shown) interposed between the semiconductor chips and the circuit substrate 2, electrically connecting the semiconductor chips (not shown) to the circuit substrate 2 via wires (not shown), molding the semiconductor chips (not shown) with resin 3, and dividing the circuit substrate 2 by dicing or die machining.

In FIG. 4, the circuit substrate is bonded and fixed with dicing tape 22 on which the plurality of molding semiconductor devices are formed, and the molding semiconductor devices are cut from the circuit substrate by cutting a cut region K with a dicing blade 21.

In the molding semiconductor device of FIG. 4, the vias and the seal ring of the first embodiment are disposed in the cut region K. In other words, in the first embodiment, the vias and the seal ring are disposed on the corners and the outer periphery of the molding semiconductor device, whereas in the second embodiment, the vias and the seal ring are disposed in the cut region K adjacent to the region of the molding semiconductor device. In the example of FIG. 4, the region adjacent to the outer periphery of the molding semiconductor device is the outer periphery of the cut region K that is adjacent to the molding semiconductor device. The vias in a single row are disposed over the outer periphery of the cut region K.

By disposing the vias and the seal ring of the first embodiment in the cut region K, adhesion between the substrates and the core improves in the cut region K and thus unlike the prior art, it is possible to suppress exfoliation including a crack between the substrates and the core in the circuit substrate of the molding semiconductor device. The exfoliation is caused by an impulsive force applied to the circuit substrate during dicing or die machining. Moreover, since the vias and the seal ring are disposed in the cut region K, the marks of the vias and the seal ring are not left in the molding semiconductor device and thus it is possible to eliminate the need for a space for the vias and the seal ring in the molding semiconductor device, so that the size of the molding semiconductor device can be reduced.

Figure 5:
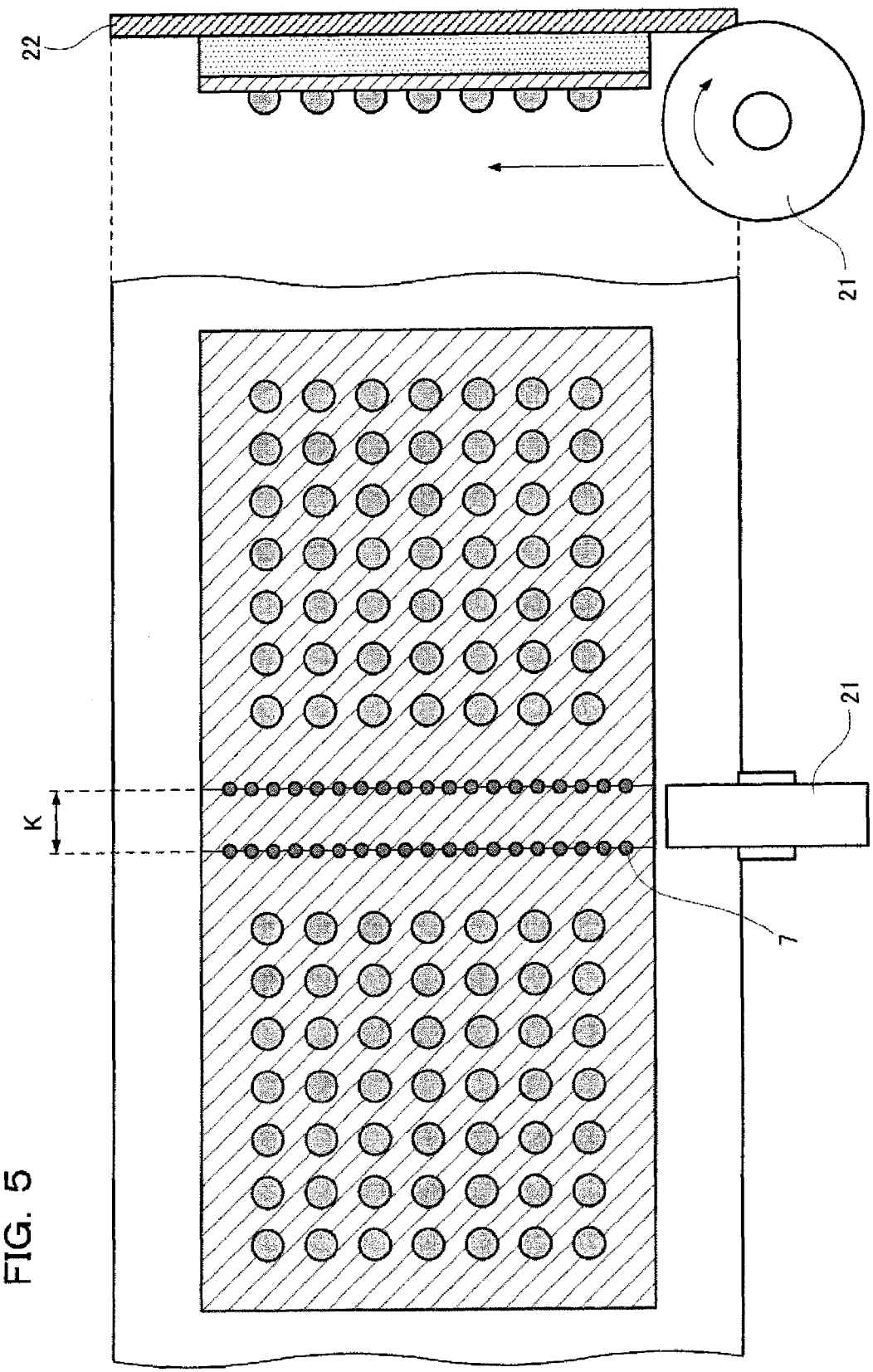
FIG. 5 shows a molding semiconductor device including vias on the boundaries of the cut region of a circuit substrate and semiconductor device regions according to the second embodiment.

FIG. 5 shows a molding semiconductor device having vias disposed on the boundaries of the cut region of a circuit substrate and semiconductor device regions according to the second embodiment.

Also in the second embodiment, as shown in FIGS. 1 to 3, a circuit substrate 2 has electrode pads and wiring provided on a first surface of a substrate 2A to electrically connect a semiconductor chip mounting region and a semiconductor chip, a cut region provided around the electrode pads and wiring to divide the circuit substrate 2 into the molding semiconductor devices, and external terminals 4 provided on a second surface of a substrate 2B, the external terminals 4 being formed on the ends of vias electrically connected from the first surface. The substrate 2A and the substrate 2B are joined to each other via a core 2C for suppressing electrical leakage between the substrates 2A and 2B, and the cut region is provided around the core 2C. A molding semiconductor device 1 is manufactured by mounting a plurality of semiconductor chips (not shown) on the circuit substrate 2 with a die attach material (not shown) interposed between the semiconductor chips and the circuit substrate 2, electrically connecting the semiconductor chips (not shown) to the circuit substrate 2 via wires (not shown), molding the semiconductor chips (not shown) with resin 3, and dividing the circuit substrate 2 by dicing or die machining.

In FIG. 5 the circuit substrate on which the plurality of molding semiconductor devices are formed is bonded and fixed with dicing tape 22, and the circuit substrate is divided into the molding semiconductor devices by cutting a cut region K with a dicing blade 21.

The molding semiconductor device of FIG. 5 has the vias or a seal ring on the boundaries of the cut region and the semiconductor device regions.

By disposing the vias or a seal ring on the boundaries of the cut region and the semiconductor device regions, adhesion between the substrates and the core is improved on the outer periphery of the circuit substrate and thus it is possible to suppress a crack in the substrate. The crack is caused by an impulsive force applied to the circuit substrate during dicing or die machining and an impulsive force applied when the molding semiconductor device having been divided from the circuit substrate by dicing or die machining is stored in a tray or an inspection socket for electrically measuring the molding semiconductor device. Consequently, it is possible to improve the yields and productivity of the molding semiconductor device. Moreover, since the vias or a seal ring are disposed on the boundaries of the cut region and the semiconductor device regions, the marks of the vias or a seal ring are reduced in the molding semiconductor device and thus it is possible to reduce a space for the vias or a seal ring in the molding semiconductor device, so that the size of the molding semiconductor device can be reduced.

Figure 6:
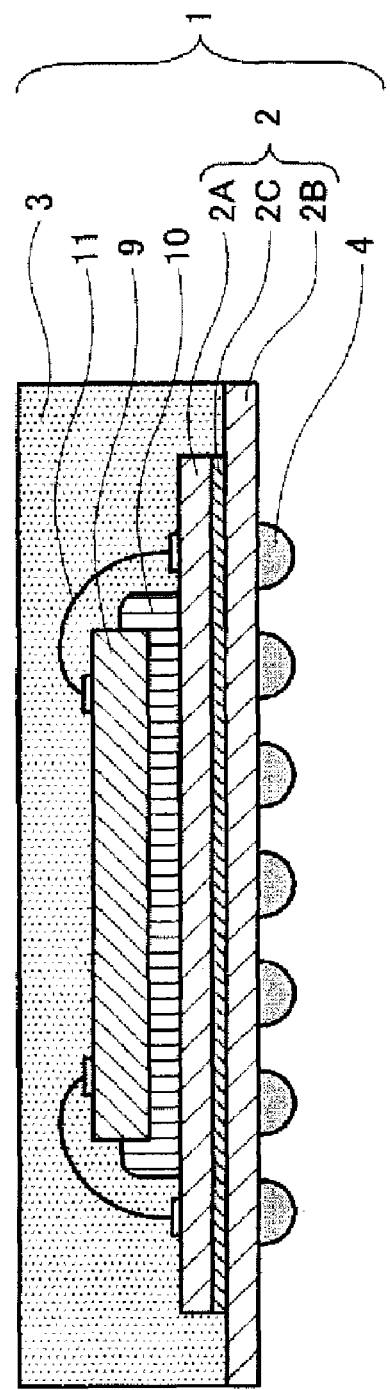
FIG. 6 shows a molding semiconductor device in which a substrate and a core are removed near the cut region of a circuit substrate according to the second embodiment.

FIG. 6 shows a molding semiconductor device in which a substrate and a core are removed near the cut region of a circuit substrate according to the second embodiment.

In FIG. 6, a circuit substrate 2 has electrode pads and wiring provided on a first surface of a substrate 2A to electrically connect a semiconductor chip mounting region and a semiconductor chip, a cut region provided around the electrode pads and wiring to divide the circuit substrate 2 into the molding semiconductor devices, and external terminals 4 provided on a second surface of a substrate 2B, the external terminals 4 being formed on the ends of vias electrically connected from the first surface. The substrate 2A and the substrate 2B are joined to each other via a core 2C for suppressing electrical leakage between the substrates 2A and 2B, and the cut region is provided around the core 2C. A molding semiconductor device 1 is manufactured by mounting a plurality of semiconductor chips 9 on the circuit substrate 2 with a die attach material 10 interposed between the semiconductor chips 9 and the circuit substrate 2, electrically connecting the semiconductor chips 9 to the circuit substrate 2 via wires 11, molding the semiconductor chips 9 with resin 3, and dividing the circuit substrate 2 by dicing or die machining.

In the molding semiconductor device of FIG. 6, the substrate 2A and the core 2C are removed near the cut region and adhesion between the substrate 2B and the resin 3 is set higher than adhesion between the substrates 2A and 2B and the core 2C. Since the substrate 2A and the core 2C are removed near the cut region and adhesion between the substrate 2B and the resin 3 is set higher than adhesion between the substrates 2A and 2B and the core 2C, it is possible to suppress exfoliation including a crack, unlike the prior art, between the substrate 2A and the core 2C or between the substrate 2B and the core 2C in the circuit substrate 2, on the corners and the outer periphery of the molding semiconductor device 1. The exfoliation is caused by an impulsive force applied to the circuit substrate 2 during dicing or die machining and an impulsive force applied when the molding semiconductor device 1 having been divided from the circuit substrate 2 by dicing or die machining is stored in a tray or an inspection socket for electrically measuring the molding semiconductor device 1. Consequently, it is possible to improve the yields and productivity of the molding semiconductor device. Another advantage is the unchangeable external shape of the molding semiconductor device 1.

The substrate 2A and the core 2C can be removed by etching using a chemical material in a circuit substrate status. Further, the removal of the substrate 2A and the core 2C may reach the cut region as long as the substrate has stiffness.

Figure 7:
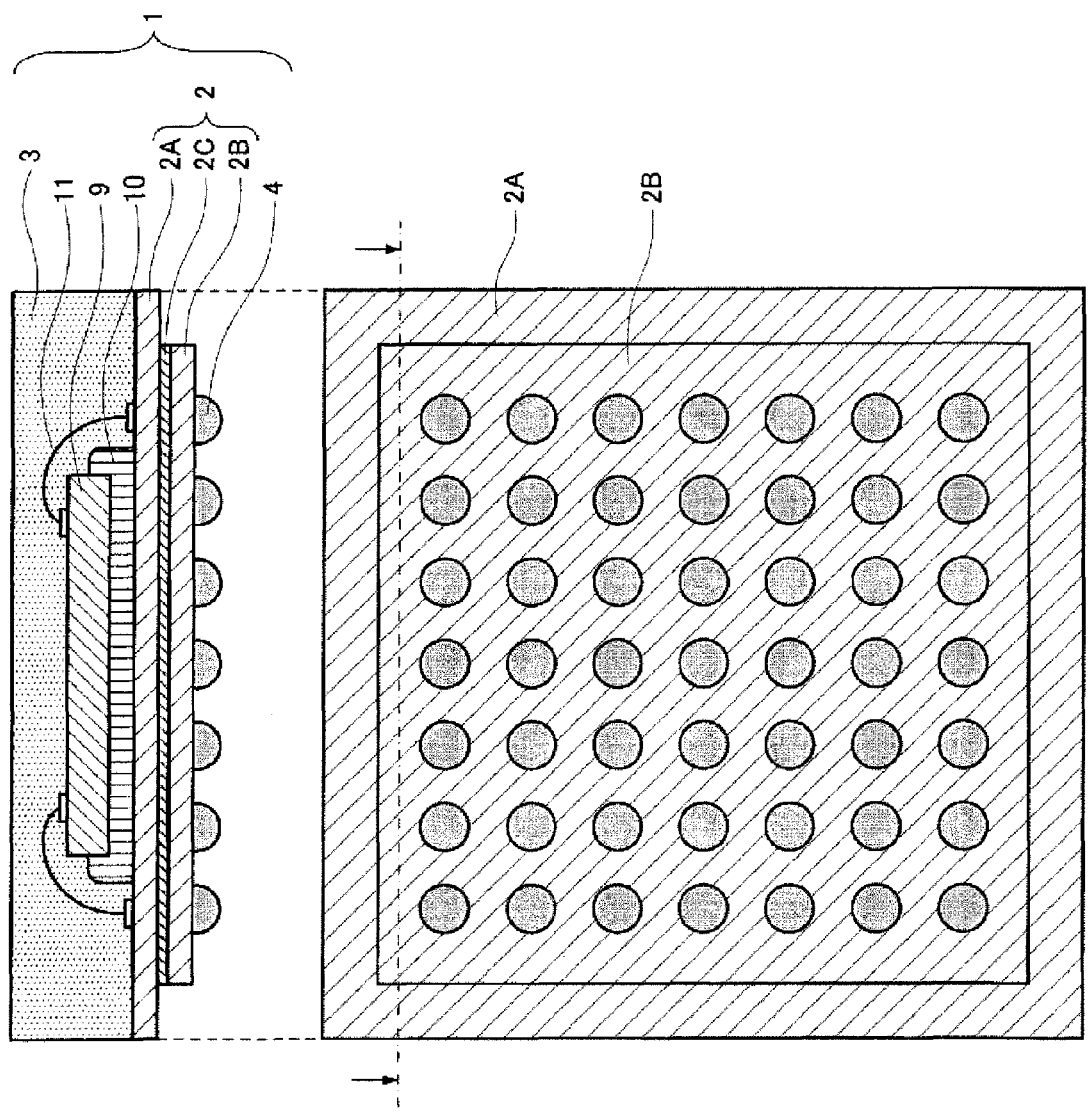
FIG. 7 shows a molding semiconductor device in which a substrate not molded with resin and a core are removed near the cut region of a circuit substrate according to the second embodiment.

FIG. 7 shows a molding semiconductor device in which a substrate not molded with resin and a core are removed near the cut region of a circuit substrate according to the second embodiment.

In FIG. 7, a circuit substrate 2 has electrode pads and wiring provided on a first surface of a substrate 2A to electrically connect a semiconductor chip mounting region and a semiconductor chip, a cut region provided around the electrode pads and wiring to divide the circuit substrate 2 into the molding semiconductor devices, and external terminals 4 provided on a second surface of a substrate 2B, the external terminals 4 being formed on the ends of vias electrically connected from the first surface. The substrate 2A and the substrate 2B are joined to each other via a core 2C for suppressing electrical leakage between the substrates 2A and 2B, and the cut region is provided around the core 2C. A molding semiconductor device 1 is manufactured by mounting a plurality of semiconductor chips 9 on the circuit substrate 2 with a die attach material 10 interposed between the semiconductor chips 9 and the circuit substrate 2, electrically connecting the semiconductor chips 9 to the circuit substrate 2 via wires 11, molding the semiconductor chips 9 with resin 3, and dividing the circuit substrate 2 by dicing or die machining.

In the molding semiconductor device of FIG. 7, the substrate 2B and the core 2C are removed near the cut region and adhesion between the substrate 2A and the resin 3 is set higher than adhesion between the substrates 2A and 2B and the core 2C. Since the substrate 2B and the core 2C are removed near the cut region, it is possible to suppress exfoliation including a crack 6, unlike the prior art, between the substrate 2A and the core 2C or between the substrate 2B and the core 2C in the circuit substrate 2, on the corners and the outer periphery of the molding semiconductor device 1. The exfoliation is caused by an impulsive force applied to the circuit substrate 2 during dicing or die machining and an impulsive force applied when the molding semiconductor device 1 having been divided from the circuit substrate 2 by dicing or die machining is stored in a tray or an inspection socket for electrically measuring the molding semiconductor device 1. Consequently, it is possible to improve the yields and productivity of the molding semiconductor device. Further, since the substrate 2B and the core 2C are removed, the size and weight of the molding semiconductor device can be reduced.

The substrate 2B and the core 2C can be removed by etching using a chemical material in a circuit substrate status. Further, the removal of the substrate and the core may reach the cut region as long as the substrate has stiffness.

FIGS. 8A and 8B show a molding semiconductor device in which one of substrates and a core are removed on the corners of a circuit substrate according to the second embodiment. FIG. 8B is a plan view showing the molding semiconductor device from the bottom. FIG. 8A is a sectional view taken along the chain line of FIG. 8B.

In FIGS. 8A and 8B, a circuit substrate 2 has electrode pads and wiring provided on a first surface of a substrate 2A to electrically connect a semiconductor chip mounting region and a semiconductor chip, a cut region provided around the electrode pads and wiring to divide the circuit substrate 2 into the molding semiconductor devices, and external terminals 4 provided on a second surface of a substrate 2B, the external terminals 4 being formed on the ends of vias electrically connected from the first surface. The substrate 2A and the substrate 2B are joined to each other via a core 2C for suppressing electrical leakage between the substrates 2A and 2B, and the cut region is provided around the core 2C. A molding semiconductor device 1 is manufactured by mounting a plurality of semiconductor chips (not shown) on the circuit substrate 2 with a die attach material (not shown) interposed between the semiconductor chips and the circuit substrate 2, electrically connecting the semiconductor chips (not shown) to the circuit substrate 2 via wires (not shown), molding the semiconductor chips with resin 3, and dividing the circuit substrate 2 by dicing or die machining.

In the molding semiconductor device of FIGS. 8A and 8B, the substrates 2A and 2B and the core 2C are removed near the corners of the molding semiconductor device. In FIGS. 8A and 8B, the substrate 2B and the core 2C are removed. Since the substrates 2A and 2B and the core 2C are removed beforehand near the corners of the molding semiconductor device close to the cut region, it is possible to suppress exfoliation including a crack, unlike the prior art, between the substrate 2A and the core 2C or between the substrate 2B and the core 2C in the circuit substrate 2, particularly on the corners of the molding semiconductor device 1. The exfoliation is caused by an impulsive force applied to the circuit substrate 2 during dicing or die machining and an impulsive force applied when the molding semiconductor device 1 having been divided from the circuit substrate 2 by dicing or die machining is stored in a tray or an inspection socket for electrically measuring the molding semiconductor device 1. Consequently, it is possible to improve the yields and productivity of the molding semiconductor device. Further, when the substrate 2B and the core 2C are removed on the corners, the size and weight of the molding semiconductor device can be reduced.

The substrates and the core can be removed by etching using a chemical material in a circuit substrate status.

FIG. 9 shows a molding semiconductor device having slopes on the corners of a circuit substrate according to the second embodiment.

In FIG. 9, a circuit substrate 2 has electrode pads and wiring provided on a first surface of a substrate 2A to electrically connect a semiconductor chip mounting region and a semiconductor chip, a cut region provided around the electrode pads and wiring to divide the circuit substrate 2 into the molding semiconductor devices, and external terminals 4 provided on a second surface of a substrate 2B, the external terminals 4 being formed on the ends of vias electrically connected from the first surface. The substrate 2A and the substrate 2B are joined to each other via a core 2C for suppressing electrical leakage between the substrates 2A and 2B, and the cut region is provided around the core 2C. A molding semiconductor device 1 is manufactured by mounting a plurality of semiconductor chips (not shown) on the circuit substrate 2 with a die attach material (not shown) interposed between the semiconductor chips and the circuit substrate 2, electrically connecting the semiconductor chips (not shown) to the circuit substrate 2 via wires (not shown), molding the semiconductor chips with resin 3, and dividing the circuit substrate 2 by dicing or die machining.

In the molding semiconductor device of FIG. 9, the substrates and the core are diagonally removed from a semiconductor chip mounting surface to an external terminal forming surface, toward the inside of the molding semiconductor device. Since slopes TS are formed beforehand near the cut region and on the circuit substrate 2 of the molding semiconductor device 1, it is possible to suppress exfoliation including a crack 6, unlike the prior art, between the substrate 2A and the core 2C or between the substrate 2B and the core 2C in the circuit substrate 2, on the corners and the outer periphery of the molding semiconductor device 1. The exfoliation is caused by an impulsive force applied to the circuit substrate 2 during dicing or die machining and an impulsive force applied when the molding semiconductor device 1 having been divided from the circuit substrate 2 by dicing or die machining is stored in a tray or an inspection socket for electrically measuring the molding semiconductor device 1, and the impulsive forces are scattered by the slopes TS of the circuit substrate 2. Consequently, it is possible to improve the yields and productivity of the molding semiconductor device. Further, since the slopes are formed on the substrate, the size and weight of the molding semiconductor device can be reduced.

The slopes on the substrate can be formed in a state of the molding semiconductor device by bevel dicing using a dicing blade having a triangular end.

Figure 10:
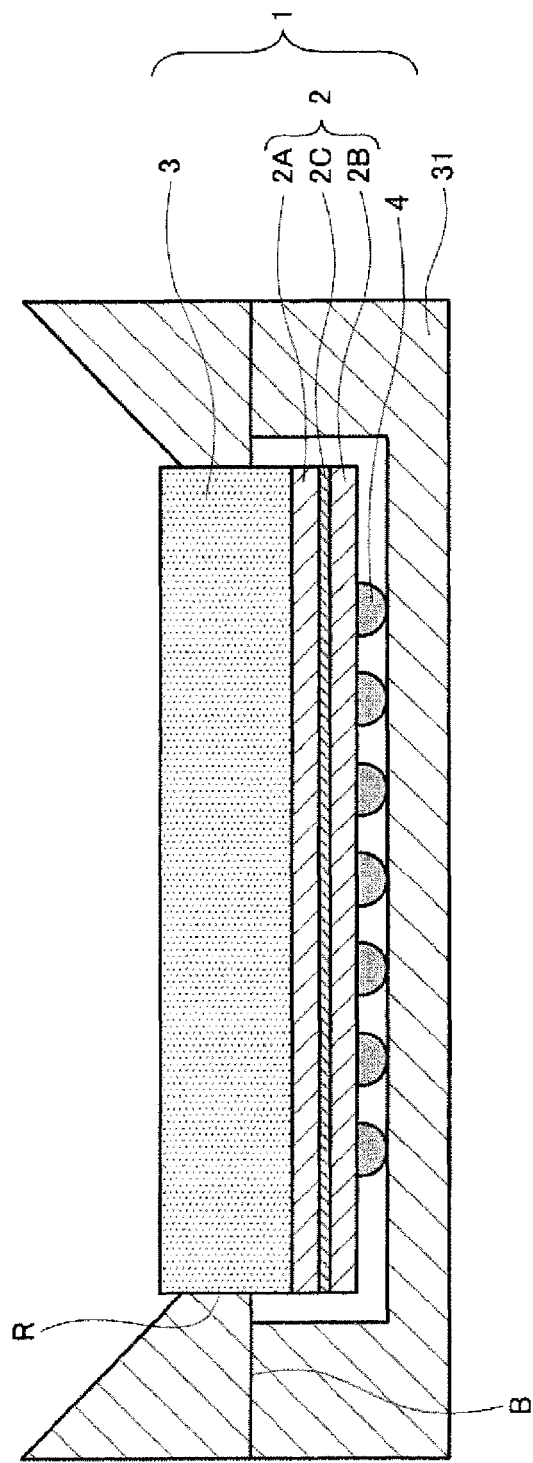
FIG. 10 shows a tray or inspection socket according to the second embodiment.

FIG. 10 shows the tray or inspection socket according to the second embodiment.

As shown in FIG. 10, in a tray or inspection socket 31 for storing or inspecting the molding semiconductor device 1, the molding semiconductor device 1 is placed on the tray or inspection socket 31 with the external terminals 4 in contact with the tray or inspection socket 31 and the molding semiconductor device 1 is held by resin sides R. As shown in FIGS. 1 to 3, the molding semiconductor device 1 is obtained by dividing, at the cut regions, the circuit substrate into the plurality of semiconductor device regions on which the semiconductor chips can be mounted. The circuit substrate 2 has the electrode pads and wiring provided on the first surface of the substrate 2A to electrically connect the semiconductor chip mounting region and the semiconductor chip, the cut region provided around the electrode pads and wiring to divide the circuit substrate 2 into the molding semiconductor devices, and the external terminals 4 provided on the second surface of the substrate 2B, the external terminals 4 being formed on the ends of the vias electrically connected from the first surface. The substrate 2A and the substrate 2B are joined to each other via the core 2C for suppressing electrical leakage between the substrates 2A and 2B, and the cut region is provided around the core C. The molding semiconductor devices 1 are formed by mounting the plurality of semiconductor devices on the circuit substrate 2 having the cut regions on the outer periphery, and performing dicing or die machining on the cut regions.

With the tray or inspection socket 31, the molding semiconductor device 1 is held by the resin sides R without coming into contact with the circuit substrate 2. The tray or inspection socket 31 does not come into contact with the circuit substrate 2 and does not cause an impulsive force applied to the circuit substrate 2, so that a crack in the substrate can be suppressed. Consequently, the quality and productivity of the molding semiconductor device 1 can be improved. For inexpensive mass production, the tray or inspection socket 31 of the present invention may be injection molded into two upper and lower parts at a division/connection line B, and then the upper and lower parts may be bonded and connected to each other.

Figure 11:
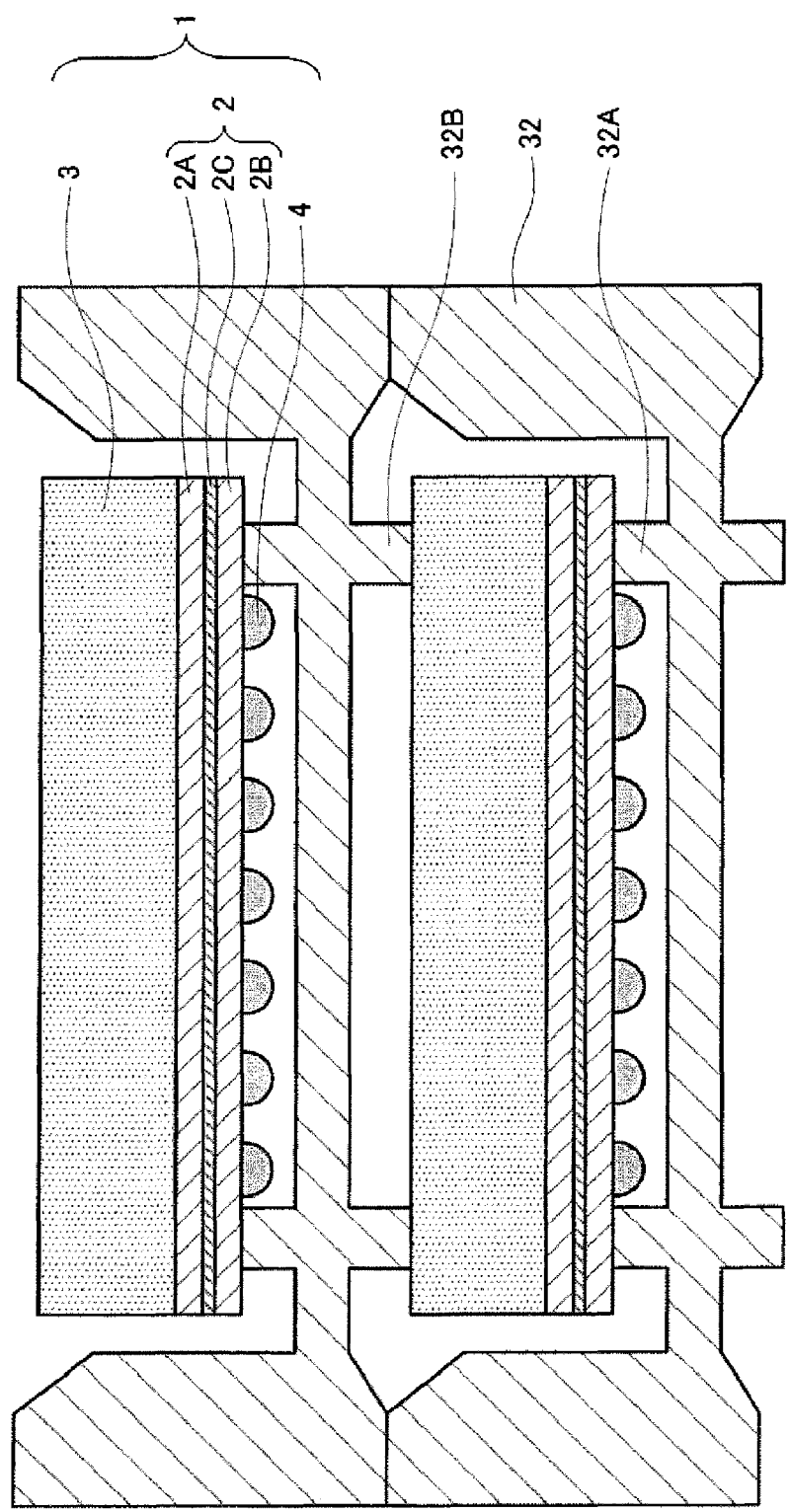
FIG. 11 shows stacking trays according to the second embodiment.

FIG. 11 shows stacking trays according to the second embodiment.

In FIG. 11, as in FIGS. 1 to 3, the molding semiconductor device 1 is formed on the circuit substrate 2 obtained by dividing, at the cut regions, the circuit substrate into the plurality of semiconductor device regions on which the semiconductor chips can be mounted. The circuit substrate 2 has the electrode pads and wiring provided on the first surface of the substrate 2A to electrically connect the semiconductor chip mounting region and the semiconductor chip, the cut region provided around the electrode pads and wiring to divide the circuit substrate 2 into the molding semiconductor devices, and the external terminals 4 provided on the second surface of the substrate 2B, the external terminals 4 being formed on the ends of the vias electrically connected from the first surface. The substrate 2A and the substrate 2B are joined to each other via the core 2C for suppressing electrical leakage between the substrates 2A and 2B, and the cut region is provided around the core C. The molding semiconductor device 1 is formed by mounting the semiconductor device on the circuit substrate 2 having the cut region on the outer periphery, and performing dicing or die machining on the cut region. The molding semiconductor device has a tray 32 for storing the molding semiconductor device 1.

The trays 32 of the present embodiment are stacked while the molding semiconductor devices 1 are stored in the trays 32. The upper tray 32 holds the surface of the resin 3 of the molding semiconductor device 1 mounted in the lower tray 32, with a regulating rib lower portion 32B. The lower tray holds the circuit substrate 2 or the external terminals 4 of the molding semiconductor device 1 mounted in the upper tray, with a regulating rib upper portion 32A. At this point, the external terminals 4 may be held directly on the bottom of the tray 32 without the provision of the regulating rib upper portion 32A.

The regulating rib lower portion 32B of the upper tray 32 holds the surface of the resin 3 of the molding semiconductor device 1 mounted in the lower tray 32, and the regulating rib upper portion 32A of the lower tray 32 holds the circuit substrate 2 or the external terminals 4, thereby suppressing a crack in the substrate unlike the prior art. Consequently, it is possible to improve the yields and productivity of the molding semiconductor device.

For inexpensive mass production, the tray 32 of the present embodiment may be injection molded. Further, in order to reduce adhesion between the regulating ribs and the resin 3, the circuit substrate 2, or the external terminals 4 of the molding semiconductor device 1, a fluorine coating may be applied to a contact portion between one of the regulating rib upper and lower portions 32A and 32B and the resin 3, the circuit substrate 2, or the external terminals 4. When the tray is made of a material such as polycarbonate (PC) that reduces the adhesion, the need for a surface coating can be reduced.

Figure 12:
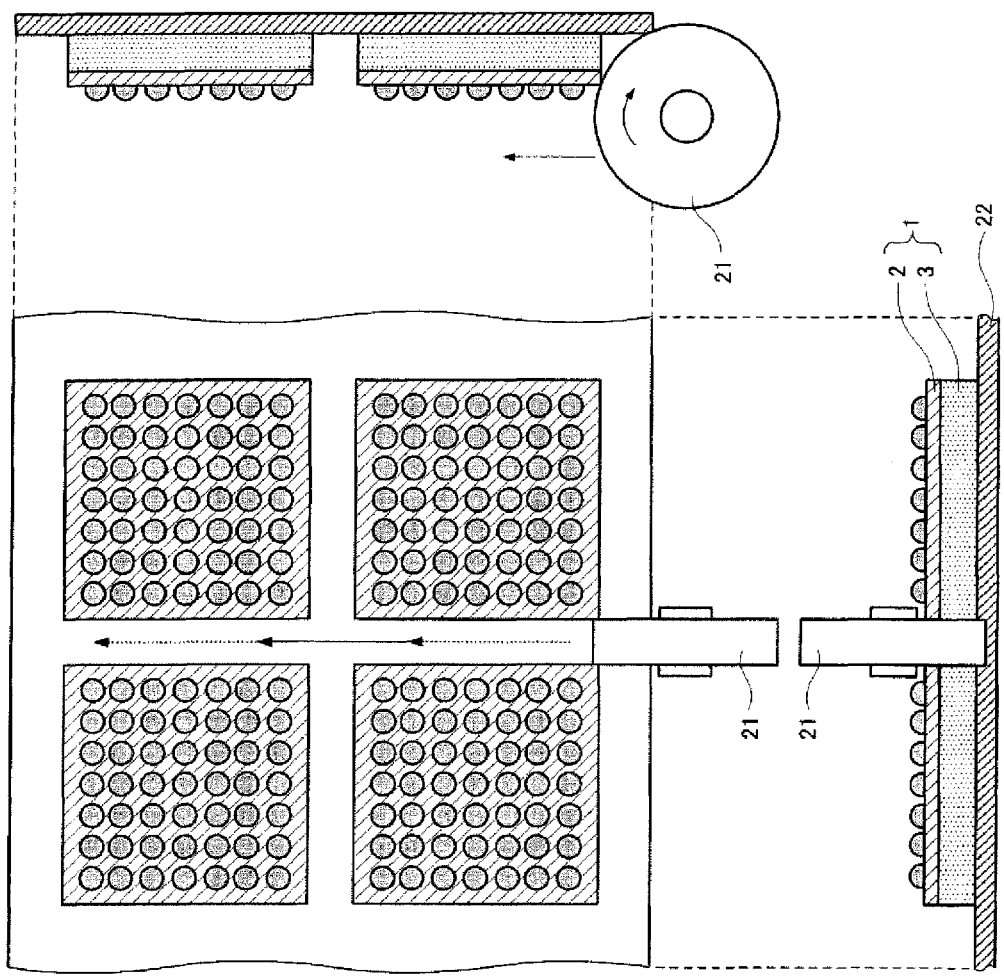
FIG. 12 is an explanatory drawing showing a method of manufacturing the molding semiconductor device according to the second embodiment.

FIG. 12 is an explanatory drawing showing a method of manufacturing the molding semiconductor device according to the second embodiment.

FIG. 12 shows a state of the circuit substrate 2 before the molding semiconductor devices 1 are manufactured by dividing the circuit substrate 2 by dicing or die machining. As shown in FIGS. 1 to 3, the circuit substrate 2 has the electrode pads and wiring provided on the first surface of the substrate 2A to electrically connect the semiconductor chip mounting region and the semiconductor chip, the cut region provided around the electrode pads and wiring to divide the circuit substrate 2 into the molding semiconductor devices, and the external terminals 4 provided on the second surface of the substrate 2B, the external terminals 4 being formed on the ends of vias electrically connected from the first surface. The substrate 2A and the substrate 2B are joined to each other via the core 2C for suppressing electrical leakage between the substrates 2A and 2B, and the cut region is provided around the core 2C. A plurality of semiconductor chips (not shown) are mounted on the circuit substrate 2 with a die attach material (not shown) interposed between the semiconductor chips and the circuit substrate 2, the semiconductor chips (not shown) are electrically connected to the circuit substrate 2 via wires (not shown), and the semiconductor chips are molded with the resin 3. In FIG. 12, the circuit substrate 2 is bonded and fixed with the dicing tape 22 when the molding semiconductor devices 1 are formed, and the molding semiconductor devices 1 are divided from the circuit substrate 2 with the dicing blade 21. In the method, upon dicing, only a portion provided in the cut region and near the corner of the molding semiconductor device 1 is diced at low speed.

According to the method of manufacturing the molding semiconductor device, dicing is performed at low speed only a portion near the corner of the molding semiconductor device 1 and in the cut region, thereby suppressing a crack particularly on the corners in the substrate. Consequently, it is possible to improve the yields and productivity of the molding semiconductor device 1.

In the present invention, the circuit substrate is about 0.1 mm to 0.5 mm in thickness and glass cloth containing epoxy resin is used as the core to prevent electrical leakage between the substrates. The resin is an epoxy thermosetting resin. Dicing can be performed on the extended conditions that the blade width is about 0.02 mm to 0.8 mm, the feed rate is 1 mm/s to 300 mm/s, and the number of revolutions is 5000 rpm to 60000 rpm.

In the present invention, the external terminals are not provided on the vias for suppressing a crack and thus it is desirable to apply a gold flash coating on the vias (made of a copper material in the present invention) to suppress oxidation. Further, although the external terminals are not provided on the vias in the present invention, the external terminals make it possible to reduce a repeated bending stress applied to the molding semiconductor device during secondary packaging, even in the absence of electrical connection with the semiconductor chip.

In the above explanation, the semiconductor chip is electrically connected to the circuit substrate by wire bonding. The semiconductor chip may be connected via bumps.

The invention claimed is:

1. A circuit substrate including cut regions, electrode pads and a circuit region for division into a plurality of molded semiconductor devices by cutting the circuit substrate into separate cut regions after mounting a plurality of semiconductor chips on the circuit substrate and molding the semiconductor chips with resin, the circuit substrate, comprising:
a first substrate;
a second substrate;
a core between the first substrate and the second substrate;
at least one region on a first surface of the circuit substrate having a semiconductor chip mounted thereon;
external terminals formed on a second surface of the circuit substrate on a backside of the first surface and electrically connected to the semiconductor chip; and
penetrating members penetrating through the first substrate, the core and the second substrate;
wherein the penetrating members are located in a corner or an outer periphery of the circuit substrate to be close to a cut region, said corner or outer periphery positioned at an outer region of electrode pads and a circuit region.

2. The circuit substrate according to claim 1, wherein the penetrating member is at least one via.

3. The circuit substrate according to claim 1, wherein the penetrating member is continuous sealing located near an outer periphery of a region of the molded semiconductor device.

4. The circuit substrate according to claim 1, wherein a penetrating member is located in each corner of a region of the molded semiconductor device.

5. The circuit substrate according to claim 2, wherein a penetrating member is located in each corner of a region of the molded semiconductor device.

6. The circuit substrate according to claim 1, wherein a penetrating member is located at each side of a region of the molded semiconductor device.

7. The circuit substrate according to claim 2, wherein the penetrating member is located at each side of a region of the molded semiconductor device.

8. The circuit substrate according to claim 4, wherein the penetrating member is located at each side of the region of the molded semiconductor device.

9. The circuit substrate according to claim 5, wherein the penetrating member is located at each side of the region of the molded semiconductor device.

10. The circuit substrate according to claim 1, wherein the penetrating member is located at a side of the cut region, the side being adjacent to the molded semiconductor device.

11. The circuit substrate according to claim 2, wherein the penetrating member is located at a side of the cut region, the side being adjacent to the molded semiconductor device.

12. A circuit substrate for division into a plurality of molded semiconductor devices by cutting the circuit substrate into separate cut regions after mounting a plurality of semiconductor chips on the circuit substrate and molding the semiconductor chips with resin,
the circuit substrate, comprising:
a first substrate;
a second substrate;
a core between the first substrate and the second substrate;
at least one region on a first surface of the circuit substrate having a semiconductor chip mounted thereon;
external terminals formed on a second surface of the circuit substrate on a backside of the first surface and electrically connected to the semiconductor chip; and
penetrating members penetrating through the first substrate, the core and the second substrate of the circuit substrate;
wherein the penetrating member is located in a boundary of a region of the molded semiconductor device and the cut region.

13. A circuit substrate for division into a plurality of molded semiconductor devices by cutting the circuit substrate into separate cut regions after mounting a plurality of semiconductor chips on the circuit substrate and molding the semiconductor chips with resin,
the circuit substrate, comprising:
a first substrate;
a second substrate;
a core between the first substrate and the second substrate;
at least one region on a first surface of the circuit substrate having a semiconductor chip mounted thereon;
external terminals formed on a second surface of the circuit substrate on a backside of the first surface and electrically connected to the semiconductor chip; and
penetrating members penetrating through the first substrate, the core and the second substrate of the circuit substrate;
wherein the penetrating member is located at a boundary of a region of the molded semiconductor device and the cut region, and the penetrating member is at least one via.

14. A circuit substrate for division into a plurality of molded semiconductor devices by cutting the circuit substrate into cut regions after mounting a plurality of semiconductor chips on the circuit substrate and molding the semiconductor chips with resin,
the circuit substrate, comprising:
a first substrate;
a second substrate;
a core interposed between the first substrate and the second substrate;
at least one region on a first surface having a semiconductor chip mounted thereon; and
external terminals formed on a second surface on a backside of the first surface and electrically connected to the semiconductor chip, wherein the circuit substrate is partially removed.

15. The circuit substrate according to claim 14, wherein when the circuit substrate is partially removed, the core and one of the first and second substrates are removed in a predetermined range on corners of a region of the molded semiconductor device.

16. The circuit substrate according to claim 14, wherein when the circuit substrate is partially removed, ends of the circuit substrate are diagonally removed from the surface for mounting the semiconductor chip to the surface for forming the external terminals, toward an inside of the molded semiconductor device.

17. A molded semiconductor device formed by mounting a semiconductor chip on a first surface of a circuit substrate according to any one of claims 1 to 16 while electrically connecting the semiconductor chip to the first surface, and cutting the circuit substrate into the cut regions.

18. A tray for storing a molded semiconductor device in which a semiconductor chip is mounted on a first surface of a circuit substrate while electrically connected to the first surface, external terminals electrically connected to the semiconductor chip are provided on a second surface on a backside of the first surface, and the first surface having the semiconductor chip mounted thereon is molded with resin, the tray comprising:
- a bottom surface contacting the external terminals; and
- a first projection on a side surface and contacting two opposed surfaces formed by the resin,
- wherein the molded semiconductor device is held by three points including the external terminals and two opposed surfaces formed by the resin.

19. An inspection socket for storing a molded semiconductor device in which a semiconductor chip is mounted on a first surface of a circuit substrate while electrically connected to the first surface, external terminals electrically connected to the semiconductor chip are provided on a second surface on a backside of the first surface, and the first surface having the semiconductor chip mounted thereon is molded with resin, the inspection socket comprising:
- a bottom surface contacting the external terminals; and
- a first projection on a side surface and contacting two opposed surfaces formed by the resin,
- wherein the molded semiconductor device is held by three points including the external terminals and two opposed surfaces formed by the resin.

* * * * *